US008049577B2

(12) United States Patent
Matsuda et al.

(10) Patent No.: US 8,049,577 B2
(45) Date of Patent: Nov. 1, 2011

(54) ELASTIC WAVE DEVICE, DUPLEXER USING THE SAME, AND COMMUNICATION APPARATUS USING THE DUPLEXER

(75) Inventors: Takashi Matsuda, Kawasaki (JP); Kazunori Inoue, Kawasaki (JP); Michio Miura, Kawaski (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 12/711,871

(22) Filed: Feb. 24, 2010

(65) Prior Publication Data
US 2010/0148887 A1    Jun. 17, 2010

Related U.S. Application Data

(63) Continuation of application No. PCT/JP2007/072161, filed on Nov. 15, 2007.

(51) Int. Cl.
H03H 9/64 (2006.01)
H03H 9/72 (2006.01)
(52) U.S. Cl. .......................... 333/133; 333/195
(58) Field of Classification Search .................. 333/133, 333/193–196; 310/313 B, 313 D
See application file for complete search history.

(56) References Cited

U.S. PATENT DOCUMENTS

| 5,773,917 | A | 6/1998 | Satoh et al. |
| 6,310,422 | B1 * | 10/2001 | Satoh et al. ............... 310/313 R |
| 7,135,944 | B2 | 11/2006 | Iwamoto et al. |
| 2004/0155730 | A1 | 8/2004 | Iwamoto et al. |
| 2006/0158281 | A1 * | 7/2006 | Garris et al. .................. 333/133 |
| 2006/0249825 | A1 * | 11/2006 | Nakano .......................... 257/678 |
| 2009/0096551 | A1 | 4/2009 | Yamagata |

FOREIGN PATENT DOCUMENTS

| EP | 1465337 A1 | 10/2004 |
| JP | 7-122961 A | 5/1995 |
| JP | 2000-196407 A | 7/2000 |
| JP | 2003-249842 A | 9/2003 |
| JP | 2003-332884 | * 11/2003 |
| JP | 2006-157174 A | 6/2006 |
| JP | 2007-116628 | * 5/2007 |
| JP | 2007-184690 A | 7/2007 |
| WO | WO-98/52279 A1 | 11/1998 |
| WO | WO 2007/114390 | * 10/2007 |

OTHER PUBLICATIONS

Jun Tsutsumi et al., "A Miniaturized 3×3-mm SAW Antenna Duplexer for the US-PCS band with Temperature-Compensated LiTaO$_3$/Sapphire Substrate", 2004 IEEE Ultrasonics Symposium, IEEE, 2004, pp. 954-958.

* cited by examiner

*Primary Examiner* — Barbara Summons
(74) *Attorney, Agent, or Firm* — Chen Yoshimura LLP

(57) ABSTRACT

An elastic wave device includes resonators having a piezoelectric substrate, a resonation unit formed on the piezoelectric substrate, and reflectors formed on respective sides of the resonation unit on the piezoelectric substrate, and bumps formed on the piezoelectric substrate. The resonators are configured such that two or more split resonators are connected in parallel, and a bump is formed in a region sandwiched between reflectors of the split resonators.

10 Claims, 15 Drawing Sheets

A-A'

ELASTIC WAVE DEVICE, DUPLEXER USING THE SAME, AND COMMUNICATION APPARATUS USING THE DUPLEXER

CROSS-REFERENCE TO RELATED APPLICATION

This application is based upon and claims the benefit of priority of the prior International Patent Application No. PCT/JP2007/072161, filed on Nov. 15, 2007 the entire contents of which are incorporated herein by reference.

FIELD

The present invention relates to an elastic wave device having an elastic wave resonator, and for example an elastic wave device having a high power durability, a duplexer using the same, and a communication apparatus using the duplexer.

BACKGROUND

An elastic wave resonator has comb-shaped electrodes that have been formed from an aluminum alloy, a Cu alloy, or the like on a piezoelectric substrate, a piezoelectric thin film, or the like and that have a period corresponding to a predetermined frequency, and the elastic wave resonator makes use of elastic waves excited by the comb-shaped electrodes. The comb-shaped electrode is called IDT (Interdigital transducer). Examples of elastic waves excited by comb-shaped electrodes are surface acoustic waves and elastic boundary waves. For example, in the case of a 1 port resonator, a dual resonance characteristic of having a resonance frequency and an antiresonance frequency is exhibited. An example of a circuit employing this characteristic is a ladder filter in which 1 port resonators that have different comb-shaped electrode periods are disposed in series arms and parallel arms to form a ladder shape (e.g., see Patent Document 1). Other examples include a DMS (Double mode SAW (Surface Acoustic Wave)) filter in which a resonator is formed by a plurality of comb-shaped electrodes, and an IIDT (Interdigitated IDT) filter that has excitation comb-shaped electrodes and reception comb-shaped electrodes.

FIG. 15A is a circuit diagram illustrating a basic configuration of a ladder filter, and FIG. 15B is a top view of the ladder filter in FIG. 15A. In the ladder filter, series resonators 102, 103, and 104 connected in series arms and parallel resonators 105, 106, and 107 connected in parallel are formed between an input terminal 101 and an output terminal 108. The series resonator 102 and the parallel resonator 105, the series resonator 103 and the parallel resonator 106, and the series resonator 104 and the parallel resonator 107 respectively configure one-stage filters, and the one-stage filters are connected in multiple stages (three stages). The input terminal 101 and the output terminal 108 in FIG. 15A are configured by an input bump 112 and an output bump 113 in FIG. 15B, and the grounds in FIG. 15A are configured by ground bumps 114, 115, and 116 that are grounded in FIG. 15B.

A ladder filter is used in a duplexer connected to an antenna of a communication apparatus. Accordingly, particularly in the case of a transmission ladder filter, there is demand for power durability due to being directly subjected to the power transmitted to the antenna. In a ladder filter, a first method of raising the power durability by design involves suppressing the occurrence of migration by raising the ability of the device to exhaust heat and lowering the temperature of the device.

Heat is exhausted from the piezoelectric substrate by allowing the heat to escape to a connection substrate mainly via a package or the like. In a conventional configuration, as illustrated in the top view of FIG. 16A and the cross-sectional diagram of FIG. 16B, a piezoelectric substrate 121 configuring a filter is bonded to a package 123 via a die bonding material 122, and heat is exhausted from the entire back face of the piezoelectric substrate 121 to the package 123. Furthermore, heat is allowed to escape from the package 123 to the connection substrate (not illustrated). Electrodes on the piezoelectric substrate 121 are connected to electrodes 124 of the package 123 via wires 125.

Also, a reduced-size package has, as illustrated in the top view of FIG. 17A and the cross-sectional diagram of FIG. 17B, a flip chip bonding (FCB) configuration in which gold bumps 132 formed on a piezoelectric substrate 131 on which a filter is formed are connected to a package 133 using a face-down method in order to achieve a small size and low profile, and heat is exhausted to the package 133 via the gold bumps 132.

Also, a second method of improving the power durability involves increasing the number of pairs (number of comb-shaped electrodes) per resonator. FIG. 18 is a top view illustrating a structure of a 1 port resonator. The 1 port resonator has a piezoelectric substrate 141, a resonation unit 143, and reflectors 142. The resonation unit 143 has two opposing excitation electrodes 144 and 145. An electrostatic capacitance C0 of the resonator is determined according to the number of pairs in the excitation electrodes 144 and 145, and the impedance of the filter is determined according to the electrostatic capacitance. Raising the number of pairs more than necessary therefore changes the impedance of the filter. In view of this, as illustrated in the top view illustrated in FIG. 19, two resonators, each having a resonation unit 146 having excitation electrodes 147 and 148 having a doubled number of pairs, are connected in series, and therefore there is no change in the capacitance with respect to the two resonators, the number of pairs in each of the resonators is doubled, and the power durability is improved.

Patent document 1: Japanese Laid-open Patent Publication 7-122961

However, problems such as the following exist in the conventional filters described above. With the first method for raising the power durability, the heat conductivity per bump is good since gold is used, but the number of heat exhaust paths is reduced, and the temperature of the filter rises. For this reason, in order to efficiently exhaust heat, it is important to dispose the bumps beside the heat generating elements (comb-shaped electrodes). FIG. 20 is a top view of a 1 port resonator. Wiring (not illustrated) for supplying power to the electrodes is drawn around in regions 149 where a bump cannot be disposed. Regions 150 where a bump can be disposed are regions on sides of reflectors 142 that are outward with respect to a resonation unit 143, and since such regions are separated from the center (the circle in the figure) of the heat generating elements, it is difficult for heat to be exhausted efficiently.

Also, with the second method for raising the power durability, the size of the resonator itself increases, thus having the problem that the device size increases. Also, since the regions where a bump can be disposed are separated from the center of the heat generating elements, there are problems such as a weakening of the effect of exhausting heat via the bumps.

SUMMARY

An elastic wave device disclosed in this application includes: a resonator having a piezoelectric substrate, a resonation unit formed on the piezoelectric substrate, and reflectors formed on respective sides of the resonation unit on the piezoelectric substrate; and a bump formed on the piezoelectric substrate. The resonator is configured such that two or more split resonators are connected in parallel, and the bump is formed in a region sandwiched between reflectors of the split resonators.

The object and advantages of the invention will be realized and attained by means of the elements and combinations particularly pointed out in the appended claims. It is to be understood that both the foregoing general description and the following detailed description are exemplary and explanatory only and are not restrictive of the invention, as claimed.

Figure 1A:
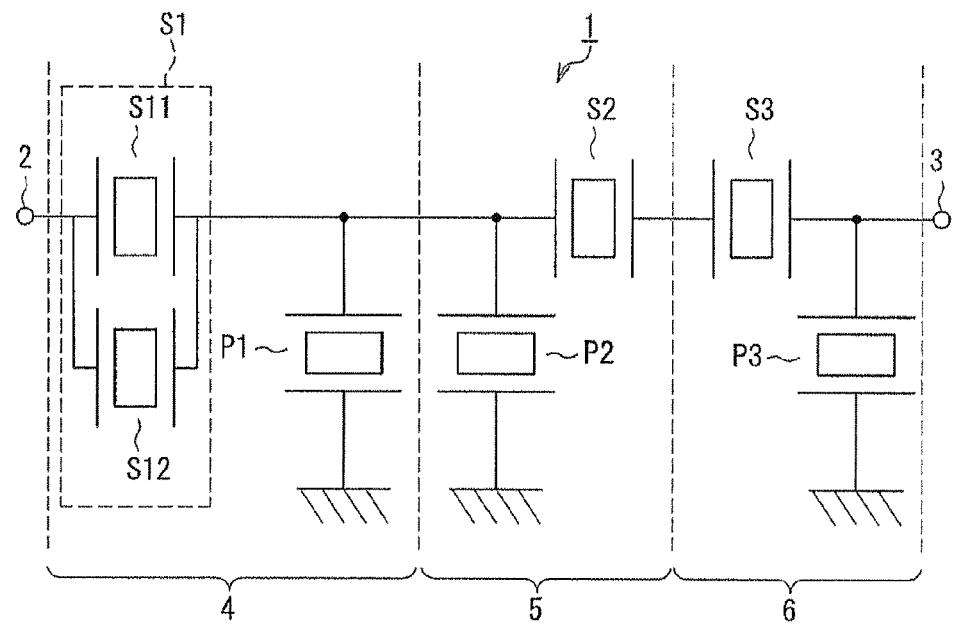
FIG. 1A is a circuit diagram illustrating a configuration of a ladder filter according to Embodiment 1 of the present invention.

REFERENCE SIGNS LIST 1 ladder filter
2 input terminal
3 output terminal
4 first-stage filter
5 second-stage filter
6 third-stage filter
11, 21, 31, 51 piezoelectric substrate
12 input bump
13 output bump
14, 15, 16 ground bump
22, 32, 33, 52 resonation unit
23a, 34a, 34b first bus bar
23b, 37a, 37b second bus bar
24a, 35a, 35b first comb-shaped electrode
24b, 38a, 38b second comb-shaped electrode
25a, 36a, 36b first excitation electrode
25b, 39a, 39b second excitation electrode
26a, 26b reflector
27a, 27b, 44, 47a, 47b, 64 metal film
28a, 28b, 55, 56, 57, 65 bump
40a, 61 first signal wiring
40b, 63 second signal wiring
41a, 41b outer reflector
42a, 42b inner reflector
43 inner region where a bump can be formed
45 inner bump
46a, 46b outer region where a bump can be formed
48a, 48b outer bump
53, 54 leader wiring
62 ground bump
66 signal wiring bump
71 antenna
72 duplexer
73 transmission-side signal processing unit
74 reception-side signal processing unit
75 microphone
76 speaker
77 transmission filter
78 reception filter
S1 combined series resonator S11, P11 first split resonator
S12, P12 second split resonator
S2, S3 series resonator
P1, P2, P3 parallel resonator

DESCRIPTION OF EMBODIMENTS

The elastic wave device disclosed in this application is connected to a package or a connection substrate with use of a bump in order to receive a supply of power during use and in order for the position of the elastic wave device to be fixed. Since the bump is formed in a region sandwiched between the reflectors of the split resonators, heat generated by the split resonators is efficiently exhausted, and the power durability is improved over that in the case of using a non-split resonator.

Also, a configuration is possible in which the elastic wave device has signal wiring connected to the resonation unit, and the bump is surrounded by the signal wiring and the reflectors.

Also, a configuration is possible in which the bump is connected to a ground. Also, a configuration is possible in which the bump is connected to external wiring.

Also, a configuration is possible in which the split resonators each have the same number of pairs of comb-shaped electrodes. Due to forming the same number of pairs, the same amount of heat is generated by the split resonators, thus improving the efficiency with which heat is exhausted from the bump sandwiched between the reflectors of the split resonators.

Also, a configuration is possible in which, in each of the split resonators, comb-shaped electrodes are formed using the same design. According to this configuration, the split resonators each have the same resonance frequency and antiresonance frequency. Also, it is possible to prevent signals from becoming attenuated due to signal reflection and the like. Examples of "the same design" include the material, width, aperture length (length along which a comb-shaped electrode opposes another comb-shaped electrode), and number of the comb-shaped electrodes all being the same, with the exception of manufacturing error.

Also, a configuration is possible in which a material of the bump is Au. Using highly conductive Au enables improving the heat-exhaust efficiency.

A filter of the present embodiment has a plurality of resonators as the elastic wave device described above, and the plurality of resonators are connected.

This configuration enables raising the power durability. The filter can include the elastic wave device that has the plurality of resonators. At least one of the plurality of resonators includes at least two split resonators that are connected in parallel, and the bump is formed in a region sandwiched between the split resonators.

Also, a duplexer of the present embodiment includes: a transmission filter; and a reception filter having a pass frequency band different from that of the transmission filter, wherein at least one of the transmission filter and the reception filter is configured using the filter described above. This configuration enables improving the power durability of the filter, and at the same time improving the power durability of the duplexer as well.

Also, a communication apparatus of the present embodiment can have a configuration including: an antenna; the above-described duplexer that is connected to the antenna; and a signal processing unit connected to the duplexer. This configuration enables improving the power durability of the duplexer, and at the same time improving the power durability of the communication apparatus as well.

According to the preferred embodiment of present invention, resonator in the elastic wave device is split into at least two split resonators each having a halved number of pairs and a bump is provided between the split resonators of a resonator in which two split resonators are connected in parallel, thus enabling providing an elastic wave device having a high power durability in which the heat dissipation efficiency is increased without a change in capacitance, a duplexer using the same, and a communication apparatus using the duplexer.

Embodiment 1

FIG. 1A is a circuit diagram illustrating a configuration of a ladder filter 1 according to Embodiment 1 of the present invention. In the ladder filter 1, a first-stage filter 4, a second-stage filter 5, and a third-stage filter 6 are connected in a cascade between an input terminal 2 and an output terminal 3

The first-stage filter 4 has a combined series resonator S1 disposed in a series arm and a parallel resonator P1 disposed in a parallel arm. The second-stage filter 5 has a series resonator S2 disposed in a series arm and a parallel resonator P2 disposed in a parallel arm. The third-stage filter 6 has a series resonator S3 disposed in a series arm and a parallel resonator P3 disposed in a parallel arm. The combined series resonator S1 is formed by connecting a first split resonator S11 and a second split resonator S12 in parallel. The combined series resonator S1 includes the first split resonator S11 and the second split resonator S12. That is to say, combined series resonator S1 is split into two split resonator S11, S12.

The resonance frequency of the combined series resonator S1, the second series resonator S2 and the third series resonator S3 is frs, and the antiresonance frequency thereof is fas. The resonance frequency of the first parallel resonator P1, the second parallel resonator P2, and the third parallel resonator P3 is frp, and the antiresonance frequency thereof is fap. The resonance frequency frs of the series resonators and the antiresonance frequency fap of the parallel resonators are set so as to be substantially the same frequency, and the ladder filter 1 operates as a bandpass filter.

Figure 1B:
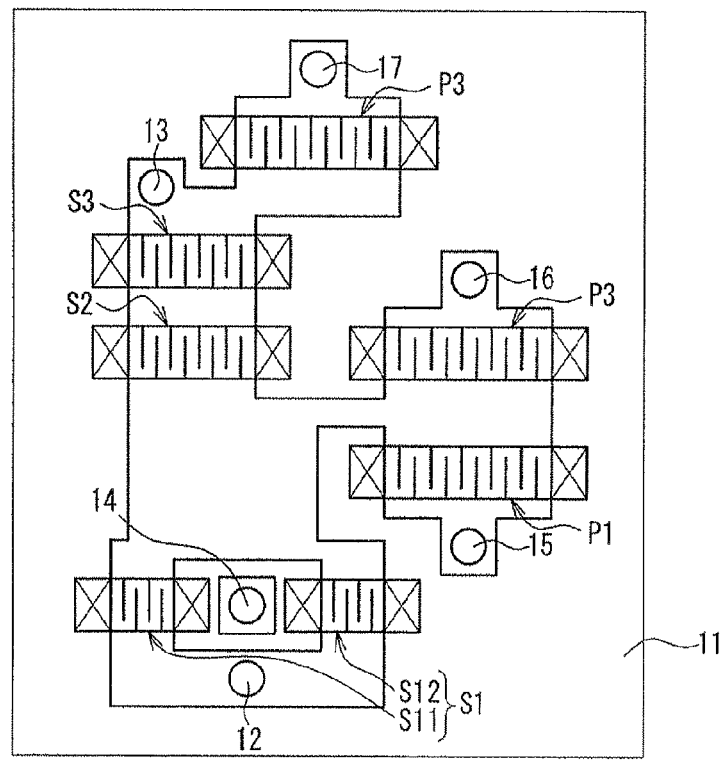
FIG. 1B is a top view illustrating the configuration of the ladder filter according to Embodiment 1 of the present invention.

FIG. 1B is a top view illustrating a configuration of the ladder filter 1. In the ladder filter 1, elements are formed on a piezoelectric substrate 11. The ladder filter 1 is configured such that bumps are connected to a connection substrate or a package (not illustrated) using a face-down method. An input bump 12 specifically configures the input terminal 2 in FIG. 1A, and the input bump 12 is electrically connected to external wiring (not illustrated) of the connection substrate. An output bump 13 specifically configures the output terminal 3 in FIG. 1A, and the output bump 13 is electrically connected to external wiring of the connection substrate. Ground bumps 15 to 17 are electrically connected to grounds (not illustrated) of the connection substrate on which the ladder filter 1 is mounted. An internal bump 14 is formed in a region sandwiched between the first split resonator S11 and the second split resonator S12 (on a line segment connecting the first split resonator S11 and the second split resonator S12).

Figure 2A:
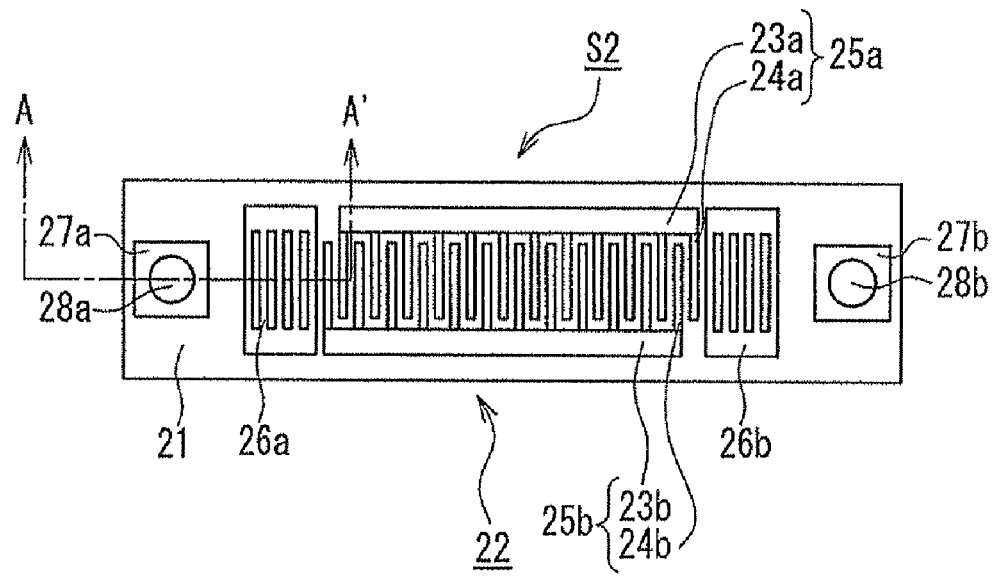
FIG. 2A is a top view illustrating a configuration of a second series resonator in a ladder filter according to an embodiment of the present invention.
Figure 2B:
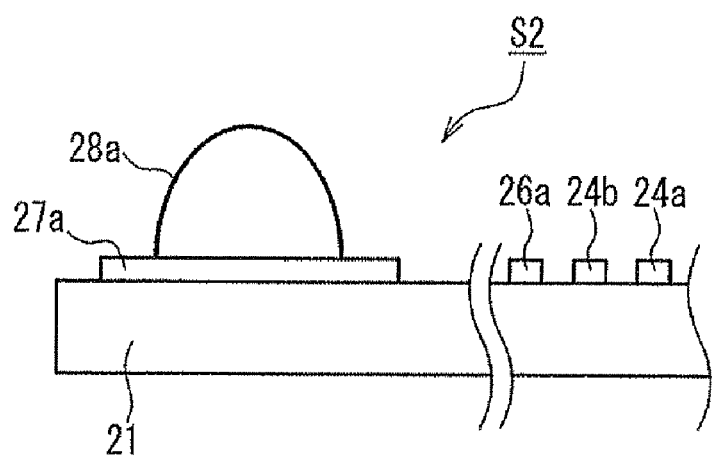
FIG. 2B is a cross-sectional diagram illustrating a cross section taken along a line A-A in FIG. 2A.

FIG. 2A is a top view illustrating a configuration of the second series resonator S2, and FIG. 2B is a cross-sectional diagram illustrating a cross section taken along a line A-A' in FIG. 2A. The third series resonator S3, the first parallel resonator P1, the second parallel resonator P2, and the third parallel resonator P3 have the same configuration as the second series resonator S2. The second series resonator S2 illustrated in FIG. 2A is a SAW 1 port resonator. The second series resonator P2 has a resonation unit 22 and reflectors 26a and 26b. The resonation unit 22 has a piezoelectric substrate 21, and a first excitation electrode 25a and a second excitation electrode 25b formed on the piezoelectric substrate 21.

The first excitation electrode 25a is formed by connecting a plurality of first comb-shaped electrodes 24a to a first bus bar 23a. Likewise, the second excitation electrode 25b is formed by connecting a plurality of second comb-shaped electrodes 24b to a second bus bar 23b. The first excitation electrode 25a and the second excitation electrode 25b are disposed in opposition such that the first comb-shaped electrodes 24a and the second comb-shaped electrodes 24b alternate in a row. The reflectors 26a and 26b are formed on respective sides of the resonation unit 22 in a direction perpendicular to the lengthwise direction of the first comb-shaped electrodes 24a.

Metal films 27a and 27b are formed on sides of the reflectors 26a and 26b opposite from where the resonation unit 22 is formed. Bumps 28a and 28b are formed on the metal films 27a and 2'7b. The bumps 28a and 28b discharge heat generated in the resonation unit 22. In order to be used as heat conduction paths for such a purpose, such bumps are preferably provided close to the resonation unit 22, more specifically beside the reflectors 26a and 26b where disposition is possible. The bumps 28a and 28b are connected to the package, and are electrically connected to the resonation unit 22. However, a configuration in which the bumps 28a and 28b are not connected to the resonation unit 22 is also possible. Also, there is no need for the formation positions of the bumps 28a and 28b to be on the sides of the reflectors 26a and 26b opposite from the resonation unit 22, and the bumps 28a and 28b do not need to be provided if they are unnecessary.

Figure 3:
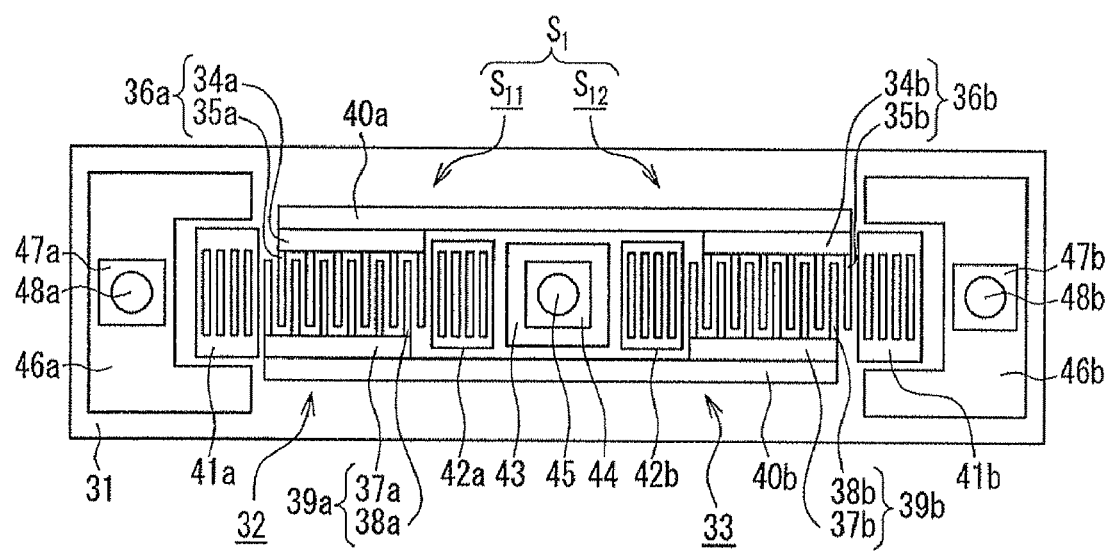
FIG. 3 is a top view illustrating a configuration of a combined series resonator in a ladder filter according to an embodiment of the present invention.

FIG. 3 is a top view illustrating a configuration of the combined series resonator S1. The combined series resonator S1 is configured by the first split resonator S11 and the second split resonator S12 provided on a piezoelectric substrate 31. The first split resonator S11 has a resonation unit 32, an outer reflector 41a, and an inner reflector 42a. The resonation unit 32 has a first excitation electrode 36a and a second excitation electrode 39a. Likewise, the second split resonator S12 has a resonation unit 33, an outer reflector 41b, and an inner reflector 42b. The resonation unit 33 has a first excitation electrode 36b and a second excitation electrode 39b. The resonation unit 32 and the resonation unit 33 are each connected to first signal wiring 40a, and furthermore are each connected to second signal wiring 40b.

The first excitation electrode 36a and the second excitation electrode 39a are disposed in opposition, and the first excitation electrode 36b and the second excitation electrode 39b are disposed in opposition, such that first comb-shaped electrodes 35a and second comb-shaped electrodes 38a alternate in a row, and first comb-shaped electrodes 35b and second comb-shaped electrodes 38b alternate in a row. In the first excitation electrode 36a, the first comb-shaped electrodes 35a are each connected to a first bus bar 34a. Likewise, in the second excitation electrode 39a, the second comb-shaped electrodes 38a are each connected to a second bus bar 37a. In the first excitation electrode 36b, the first comb-shaped electrodes 35b are each connected to a first bus bar 34b. Likewise, in the second excitation electrode 39b, the second comb-shaped electrodes 38b are each connected to a second bus bar 37b.

An inner region 43 where a bump can be formed is provided so as to be sandwiched between the inner reflectors 42a and 42b. A metal film 44 is formed in the inner region 43 where a bump can be formed, and an inner bump 45 is formed on the metal film 44. Also, outer regions 46a and 46b where a bump can be formed are provided on outer sides of the outer reflectors 41a and 41b. Metal films 47a and 47b are respectively formed in the outer regions 46a and 46b where a bump can be formed, and outer bumps 48a and 48b are respectively formed on the metal films 47a and 47b.

The inner bump 45 and the outer bumps 48a and 48b are connected to the package. Accordingly, heat generated by the first split resonator S11 and the second split resonator S12 is exhausted to the package via the inner bump 45 and the outer bumps 48a and 48b. The inner bump 45 and the outer bumps 48a and 48b are connected to a circuit (resonator). However, connection to a circuit is not necessary, and a configuration in which such bumps are electrically set-off from a circuit is also possible. Also, in the case in which the inner bump 45 and the outer bumps 48a and 48b are connected to a circuit, the inner bump 45 and the outer bumps 48a and 48b may be connected to external wiring or grounded. Also, there is no need for the formation positions of the outer bumps 48a and 48b to be on the sides of the outer reflectors 41a and 41b opposite from the resonation units 32 and 33. Also, the outer bumps 48a and 48b do not need to be provided if they are unnecessary.

Figure 4A:
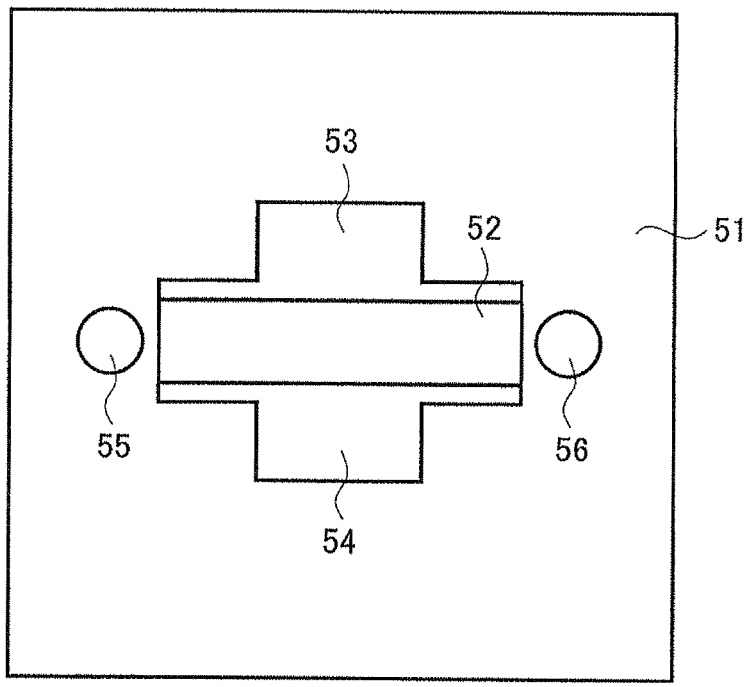
FIG. 4A is a top view illustrating a configuration of a conventional resonator.
Figure 4B:
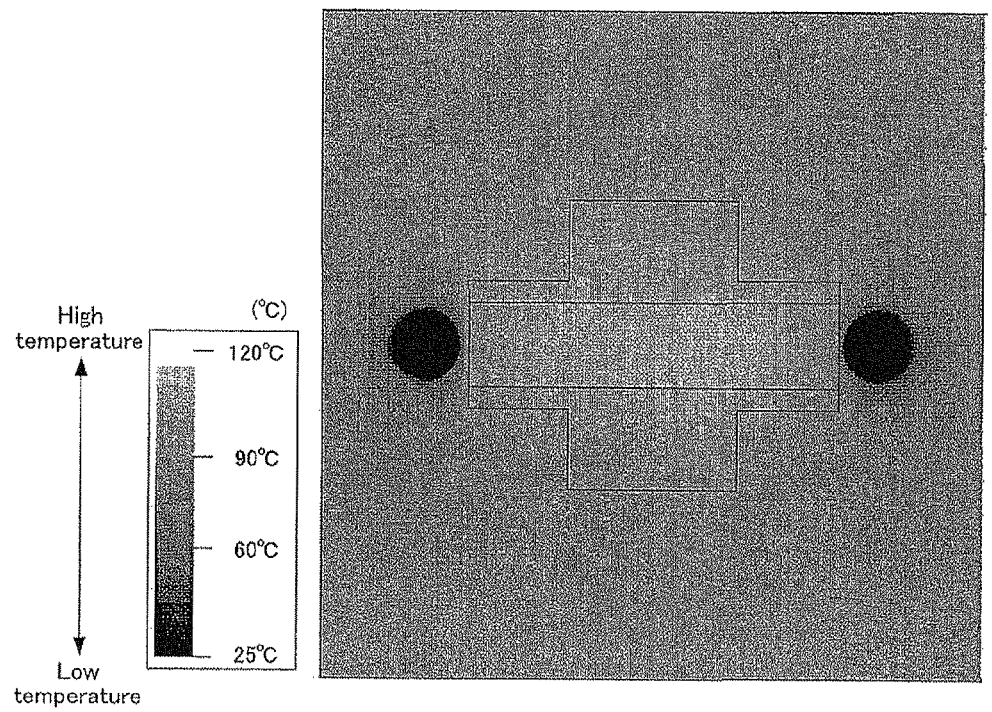
FIG. 4B is a diagram in which a temperature distribution of a piezoelectric substrate surface during driving of the resonator illustrated in FIG. 4A has been obtained by simulation.
Figure 5A:
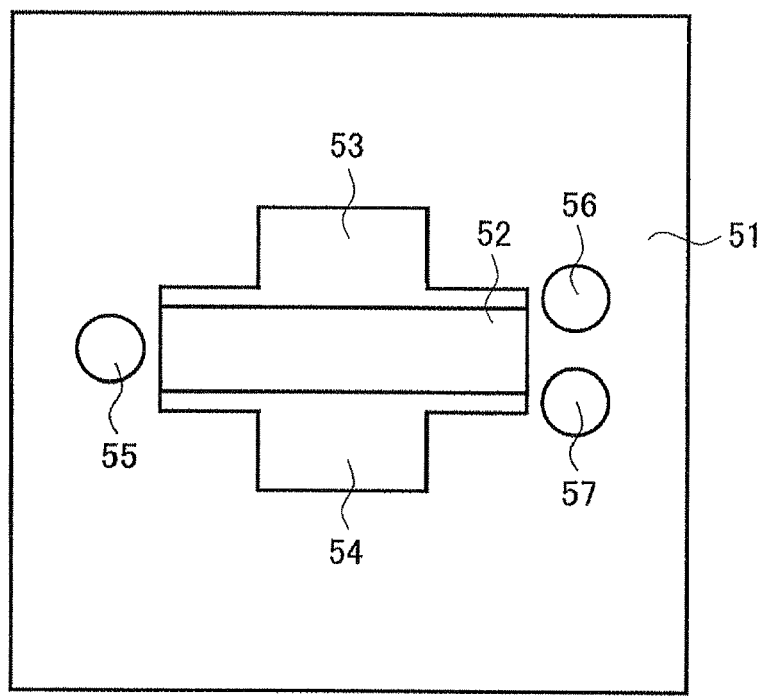
FIG. 5A is a top view illustrating a configuration of another conventional resonator.
Figure 5B:
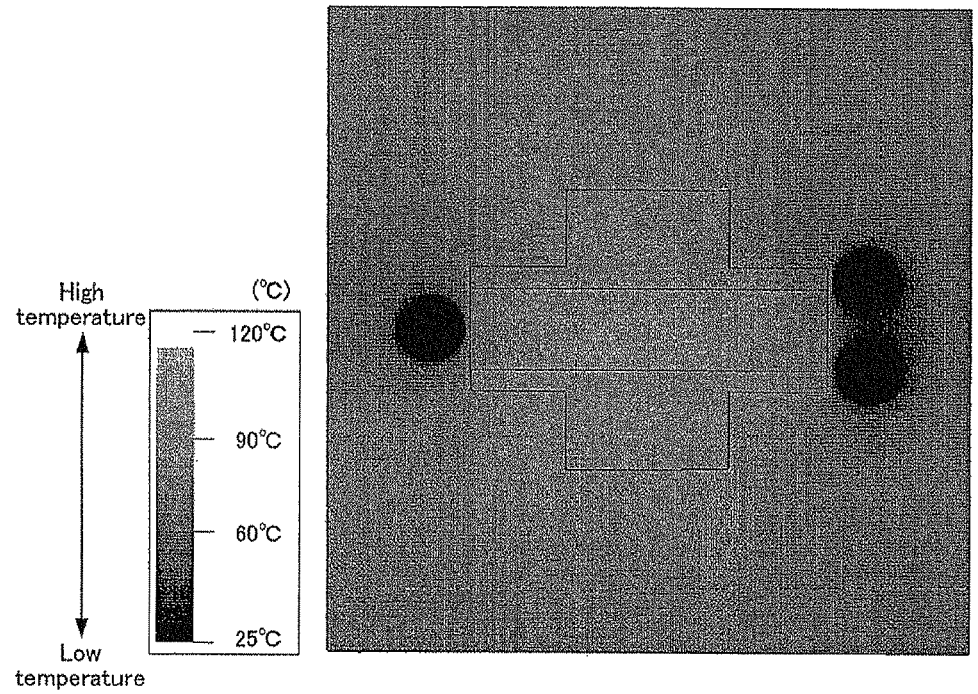
FIG. 5B is a diagram in which a temperature distribution of a piezoelectric substrate surface during driving of the resonator illustrated in FIG. 5A has been obtained by simulation.

FIGS. 4A and 5A are top views schematically illustrating configurations of conventional resonators, and FIGS. 4B and 5B are diagrams in which temperature distributions of a piezoelectric substrate surface (the side on which excitation electrodes are formed) during driving of the resonators illustrated in FIGS. 4A and 5A have been obtained by simulation. The conventional resonator illustrated in FIG. 4A has a resonation unit 52 (including reflectors) provided on a piezoelectric substrate 51, leader wiring 53 and 54 connected to the resonation unit 52, and bumps 55 and 56. The bumps 55 and 56 are formed on respective sides of the resonation unit 52 in directions where the leader wiring 53 and 54 is not formed. The temperature distribution illustrated in FIG. 4B is a result in the case of performing a temperature distribution simulation in a state in which the resonation unit 52 was provided with a 1 W heat generation source to simulate a thermally stable state in which the resonation unit 52 was driven. The simulation was performed using $LiTaO_3$ for the piezoelectric substrate 51, and using Al for the excitation electrodes and reflectors of the resonator. The sides of the bumps 55 and 56 opposite from the piezoelectric substrate 51 were connected to Cu electrodes of a ceramic substrate, and the conditions of the simulation were set such that the electrode portions were 25° C. The result of the simulation was the temperature distribution illustrated in FIG. 4B, and the maximum temperature of the piezoelectric substrate 51 was 119° C.

The resonator illustrated in FIG. 5A has the configuration of the resonator illustrated in FIG. 4A, with another bump 57 disposed adjacent to the bump 56. A temperature distribution simulation was performed on this resonator using the conditions described above. As a result, since the number of heat conduction paths to the package was raised to three, the temperature decreased more than in the case of the resonator illustrated in FIG. 4B, and the maximum temperature was 102° C., as illustrated in FIG. 5B.

Figure 6A:
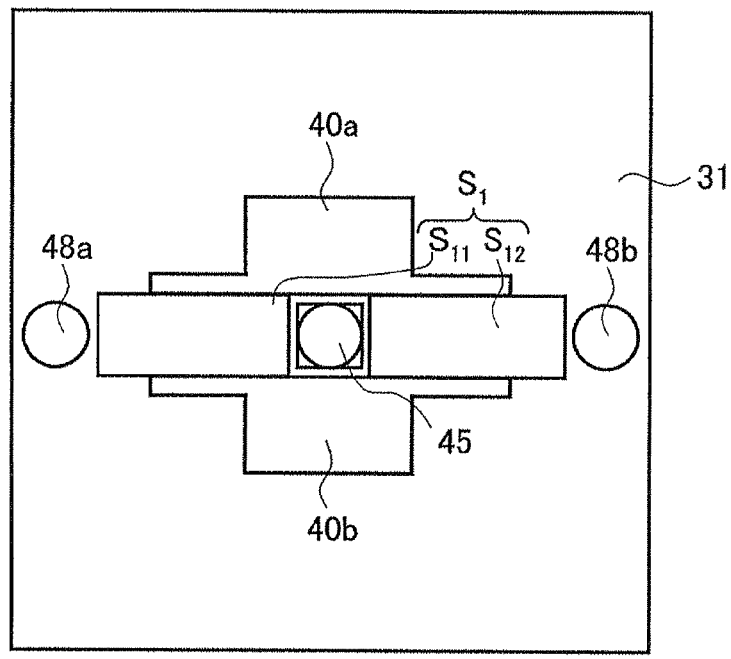
FIG. 6A is a top view illustrating a configuration of a resonator according to an embodiment of the present invention.
Figure 6B:
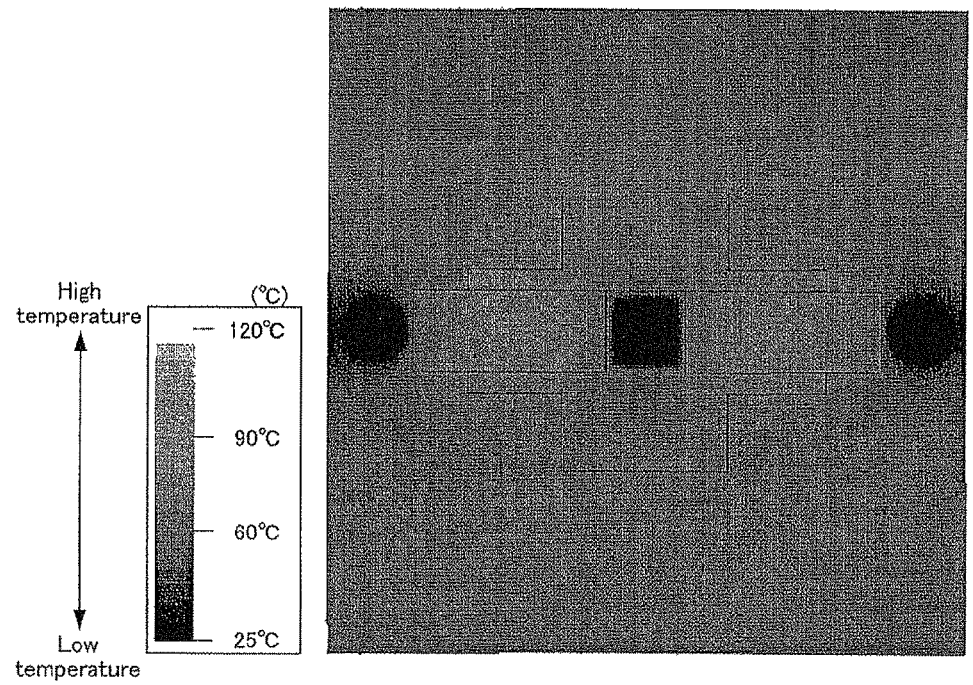
FIG. 6B is a diagram in which a temperature distribution of a piezoelectric substrate surface during driving of the resonator illustrated in FIG. 6A has been obtained by simulation.

FIG. 6A is a top view of the combined resonator S1 according to the present embodiment illustrated in FIG. 3, which has been simplified to facilitate a comparison with FIGS. 4A and 5A. FIG. 6B is a diagram in which a temperature distribution of the combined resonator S1 has been obtained by simulation likewise to the conventional resonators illustrated in FIGS. 4B and 5B. Compared to the resonator illustrated in FIG. 5B in which three bumps are formed, the temperature of the combined resonator S1 was lower, and the maximum temperature was 81° C.

Figure 7A:
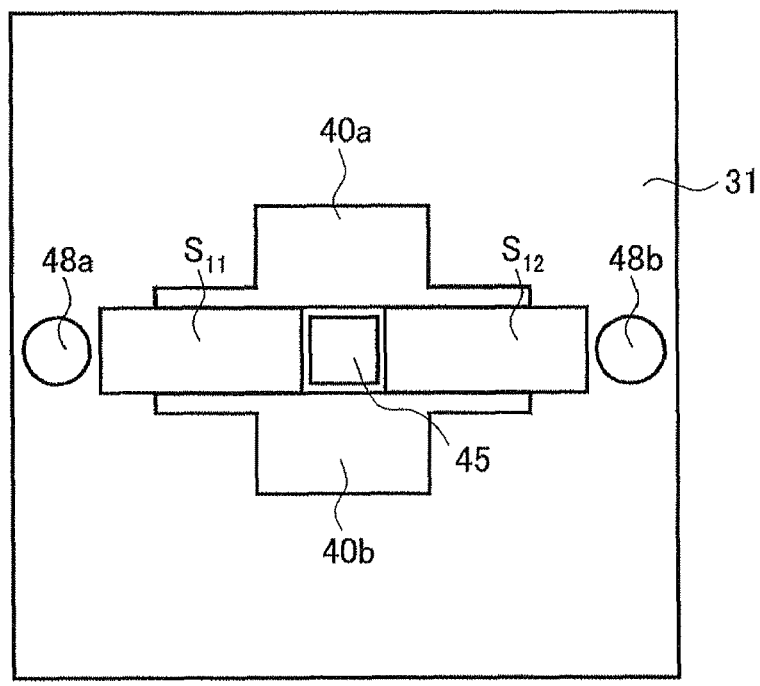
FIG. 7A is a top view illustrating a configuration of a resonator that is the resonator illustrated in FIG. 6A from which an internal bump has been removed.
Figure 7B:
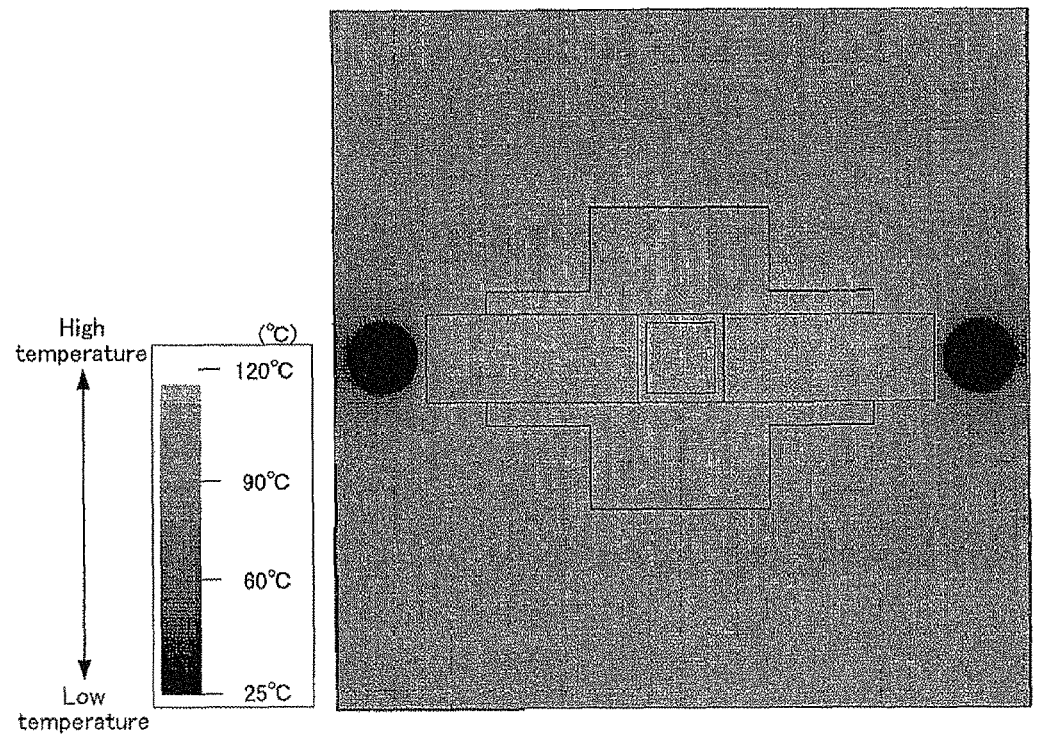
FIG. 7B is a diagram in which a temperature distribution of a piezoelectric substrate surface during driving of the resonator illustrated in FIG. 7A has been obtained by simulation.

FIG. 7A is a top view that is a simplified view of a resonator that is the combined resonator of FIG. 6A from which the inner bump 45 has been removed, for comparison. As illustrated in the simulation result illustrated in FIG. 7B, the temperature of this resonator was higher than even the resonator illustrated in FIG. 4B, and the maximum temperature was 122° C. This is because compared to the resonator in FIG. 4A, this resonator is larger, and the positions of the bumps are relatively farther from the heat generation source. In contrast, the internal bump is provided in the structure in FIG. 6A, and therefore the distance from the heat generation centers of the split resonators S11 and S12, which are the heat generation sources, to the bump is shorter than with the structure illustrated in FIG. 4A, thus improving the heat dissipation efficiency.

As described above, splitting the resonator and providing an internal bump enables efficiently allowing heat generated by the resonators to escape to the package. As a result, the power durability rises without an increase in the temperature of the resonators.

Figure 8:
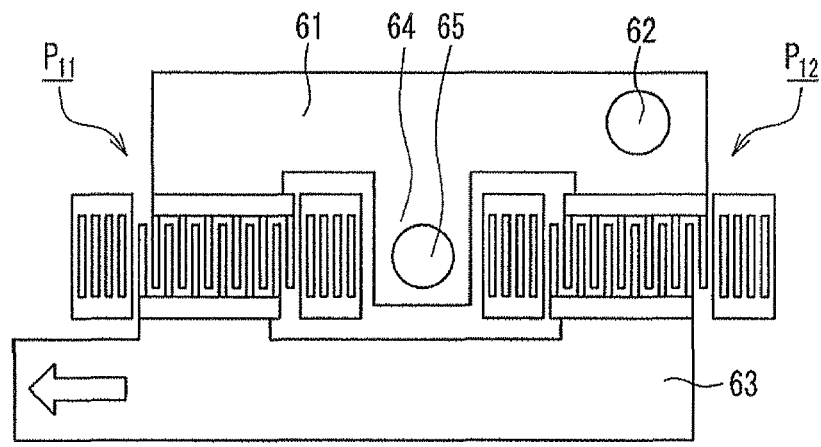
FIG. 8 is a top view illustrating an exemplary configuration of a combined parallel resonator according to an embodiment of the present invention.
Figure 9:
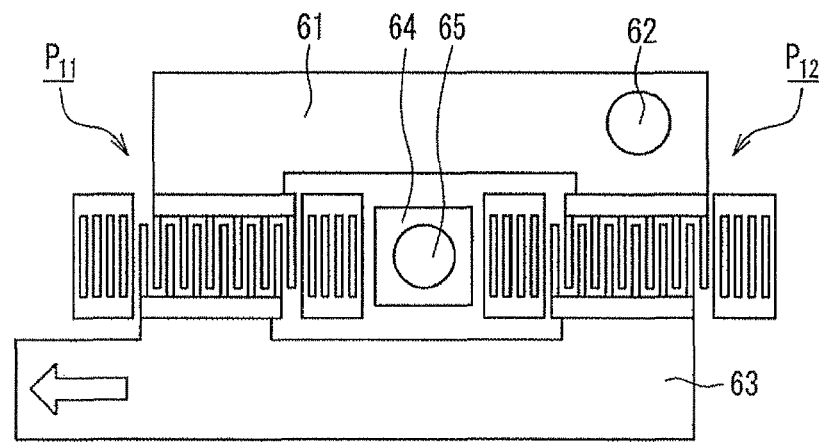
FIG. 9 is a top view illustrating an exemplary configuration of another combined parallel resonator according to an embodiment of the present invention.

FIGS. 8 and 9 are diagrams illustrating exemplary configurations of a combined parallel resonator in the case in which a combined resonator, in which two split resonators are connected in parallel, is connected in a parallel arm. In the combined parallel resonator illustrated in FIG. 8, a first split resonator P11 and a second split resonator P12 are connected to first signal wiring 61, and furthermore are connected to second signal wiring 63. A ground bump 62 electrically connected to a ground of a connection substrate (not illustrated) is formed on the first signal wiring 61. Also, the first signal wiring 61 is connected to a metal film 64 on which an internal bump 65 is formed. The second signal wiring 63 is connected to another resonator.

In the combined parallel resonator illustrated in FIG. 9, the metal film 64 is not connected to the first signal wiring 61. The other aspects of the configuration are the same as the combined resonator illustrated in FIG. 8.

FIGS. 10 to 13 are diagrams illustrating exemplary configurations of a combined series resonator in which a combined resonator, in which two split resonator are connected in parallel, is connected in a series arm. In the combined series resonator illustrated in FIG. 10, the first split resonator S11 and the second split resonator S12 are connected to the first signal wiring 40a, and furthermore are connected to the second signal wiring 40b. The first signal wiring 40a is connected to another resonator. A signal wiring bump 66 electrically connected to external wiring of a connection substrate is formed on the second signal wiring 40b. The second signal wiring 40b is connected to the metal film 44 on which the internal bump 45 is formed. The internal bump 45 is electrically connected to external wiring of the connection substrate, or is connected to an electrically set-off place.

Figure 10:
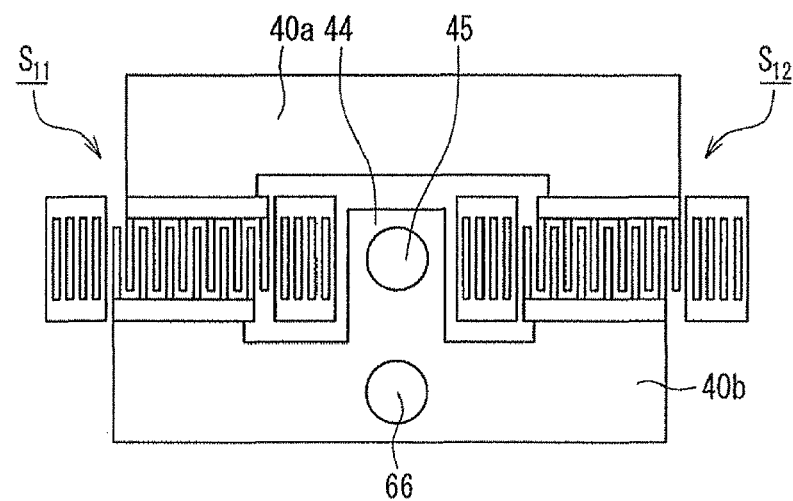
FIG. 10 is a top view illustrating an exemplary configuration of a combined series resonator according to an embodiment of the present invention.
Figure 11:
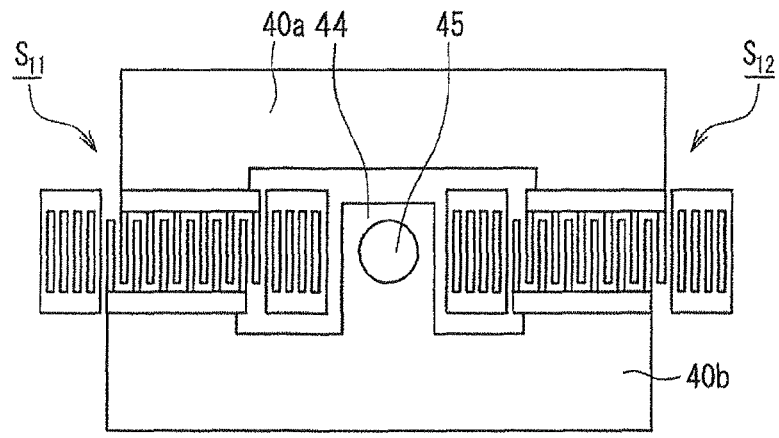
FIG. 11 is a top view illustrating an exemplary configuration of another combined series resonator according to an embodiment of the present invention.

A combined series resonator illustrated in FIG. 11 differs from the combined series resonator illustrated in FIG. 10 in that the signal wiring bump 66 is not formed on the second signal wiring 40b. The internal bump 45 is electrically connected to external wiring of the connection substrate. The other aspects of the configuration are the same as the combined series resonator illustrated in FIG. 10.

Figure 12:
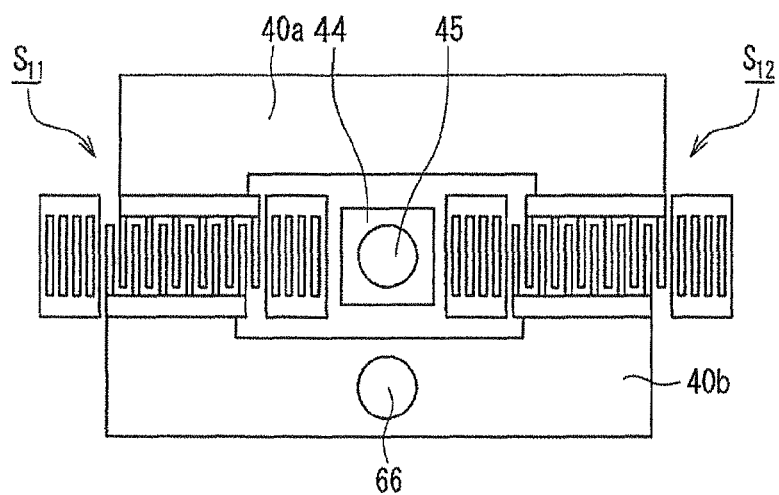
FIG. 12 is a top view illustrating an exemplary configuration of another combined series resonator according to an embodiment of the present invention.

A combined series resonator illustrated in FIG. 12 differs from the combined series resonator illustrated in FIG. 10 in that the second signal wiring 40b is not connected to the metal film 44 on which the internal bump 45 is formed. The other aspects of the configuration are the same as the combined series resonator illustrated in FIG. 10.

Figure 13:
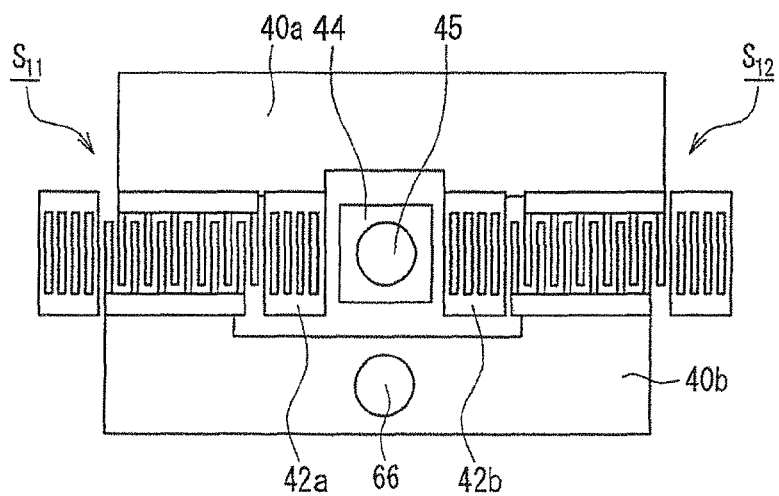
FIG. 13 is a top view illustrating an exemplary configuration of another combined series resonator according to an embodiment of the present invention.

A combined series resonator illustrated in FIG. 13 differs from the combined series resonator illustrated in FIG. 12 in that the inner reflectors 42a and 42b are connected to the first signal wiring 40a. The other aspects of the configuration are the same as the combined series resonator illustrated in FIG. 10.

The combined resonators illustrated in FIGS. 8 to 13 have a superior power durability since heat is exhausted from the internal bump 45 that is close to the comb-shaped electrodes that are the heat generation centers of the two split resonators.

As described above, unlike conventional resonators, in the filter according to the present embodiment, resonators (split resonators) having a halved number of comb-shaped electrodes are connected in parallel, and a bump is formed at a position sandwiched between the reflectors of the split resonators, thus raising the heat dissipation efficiency and raising the power durability.

Note that although exemplary configurations of combined resonators are described in the present embodiment, the configuration of the combined resonator is not limited to such exemplary configurations, and any configuration is possible as long as an internal bump is formed so as to be sandwiched between split resonators. Also, a plurality of combined resonators may be disposed in the filter. Furthermore, although examples of configuring the combined resonator by two split resonators are described in the present embodiment, the combined resonator may be formed from three or more split resonators.

Also, in the ladder filter illustrated in FIG. 1, the first-stage filter 4, the second-stage filter 5, and the third stage filter 6 may be formed so as to have the same impedance. Causing the impedance to be the same among the stages of filters enables preventing signals from being reflected between the stages of filters. Accordingly, the value of the impedance of the combined series resonator is uniquely determined according to the value of the impedance of the parallel resonator P1.

Also, although the split resonators may each have a different number of (number of pairs of) comb-shaped electrodes, the number of comb-shaped electrodes is preferably the same. As a result of causing the number of comb-shaped electrodes to be same, the same amount of heat is generated by the resonators. Accordingly, the position at which the internal bump is formed is a position enabling heat from the split resonators to be exhausted most efficiently. Also, the comb-shaped electrodes are preferably configured using the same design. Here, as one example of "the same design", the material, width, aperture length (length along which a comb-shaped electrode opposes another comb-shaped electrode), and number of the comb-shaped electrodes are all the same between the split resonators. As a result of using the same design, the split resonators each have the same resonance frequency and antiresonance frequency. Also, using the same design enables preventing signals from being attenuated due to signal reflection and the like.

Also, although the filter has been described taking the example of a ladder filter in the present embodiment, the same effects can be obtained when a lattice filter is used.

Note that the combined resonator is not limited to being applied to a filter, and may be used as an elastic wave device in other applications.

Also, although exemplary configurations in which the filter is connected to the package using a face-down method have been described, there is no limitation to using a face-down method. The same heat-exhaust effect can be obtained in any configuration in which heat is exhausted by a bump.

Embodiment 2

Figure 14:
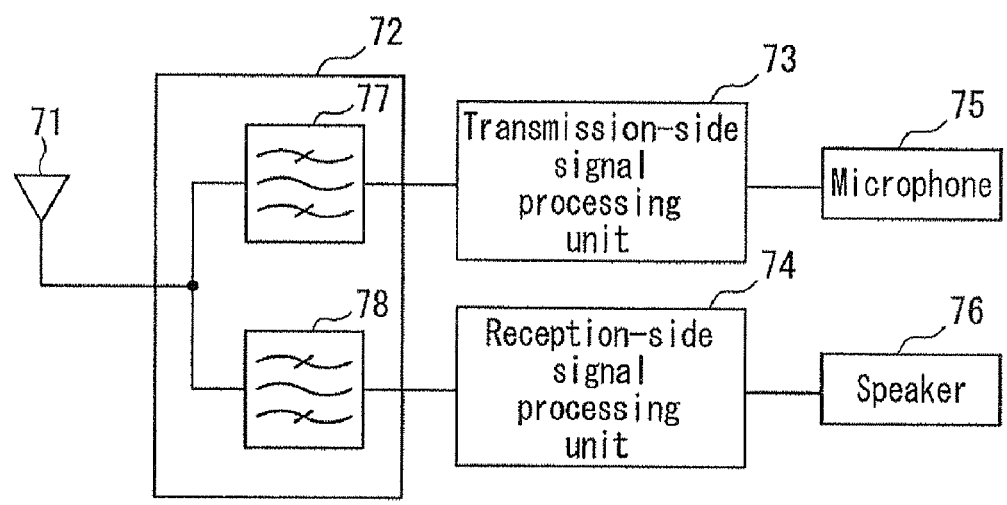
FIG. 14 is a block diagram illustrating a configuration of a communication apparatus according to Embodiment 2 of the present invention.
Figure 15A:
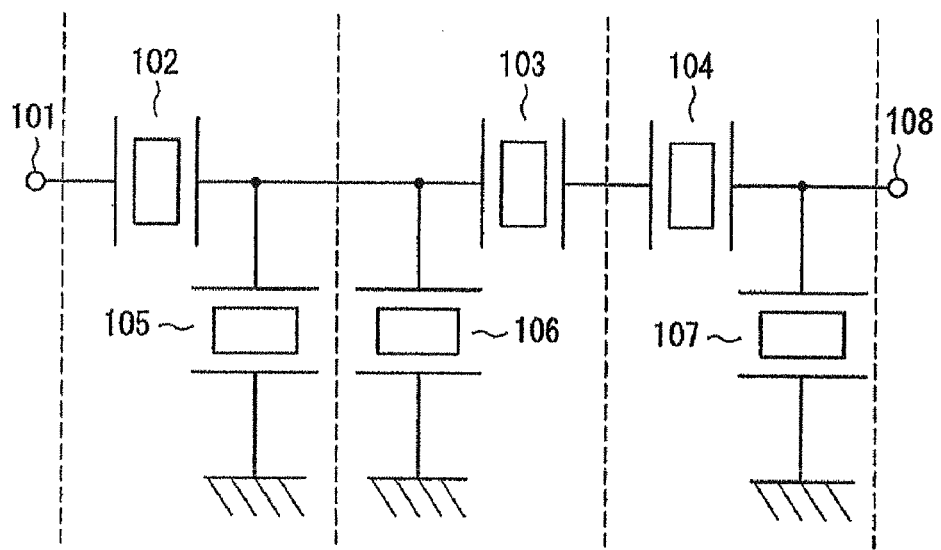
FIG. 15A is a circuit diagram illustrating a configuration of a conventional ladder filter.
Figure 15B:
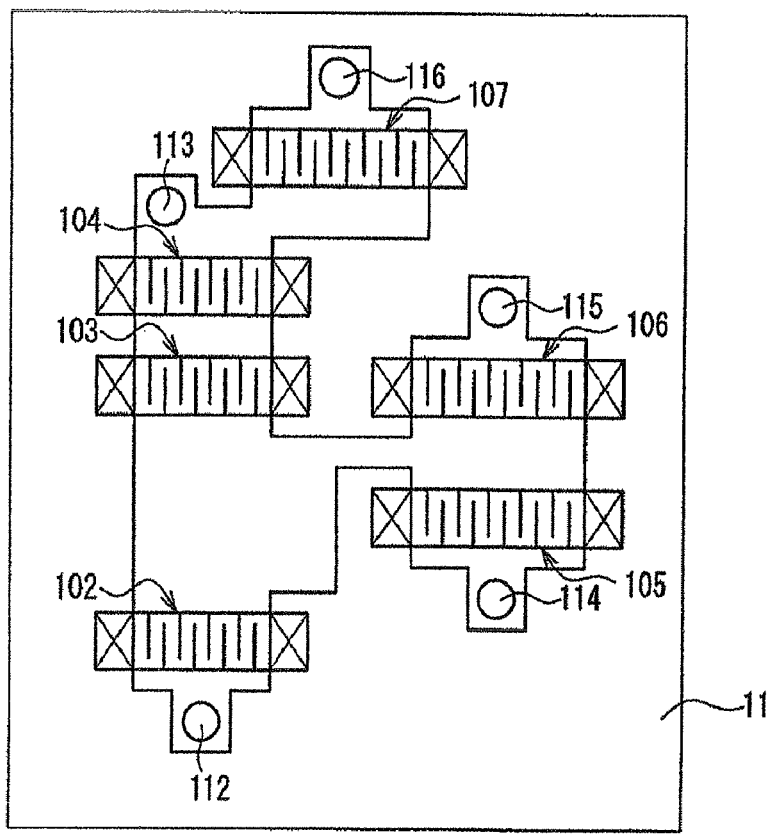
FIG. 15B is a top view of the ladder filter illustrated in FIG. 15A.
Figure 16A:
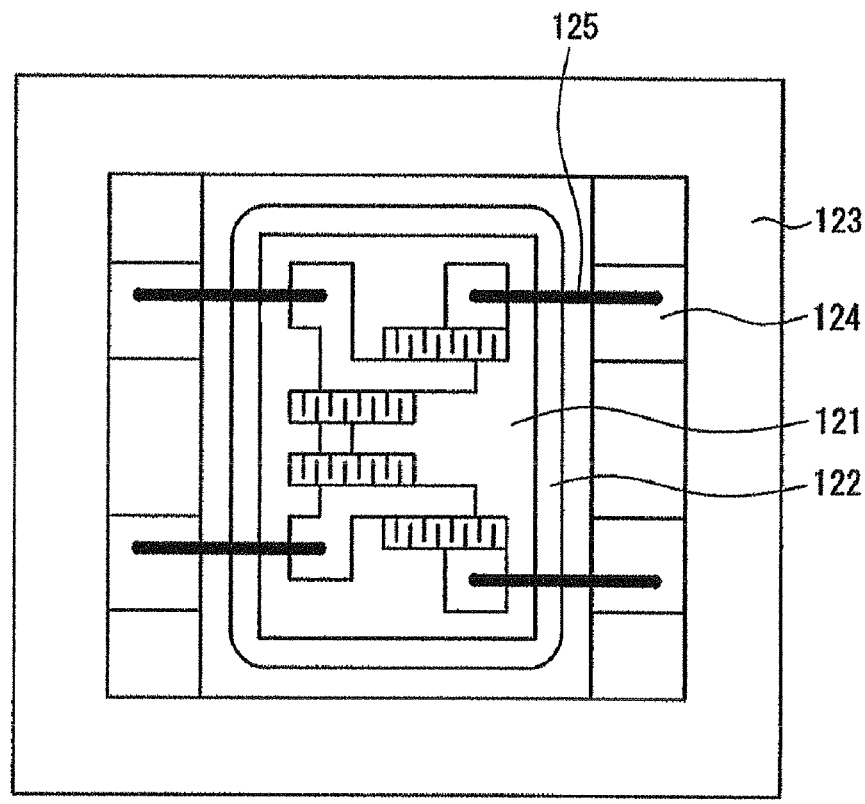
FIG. 16A is a top view illustrating a conventional filter package.
Figure 16B:
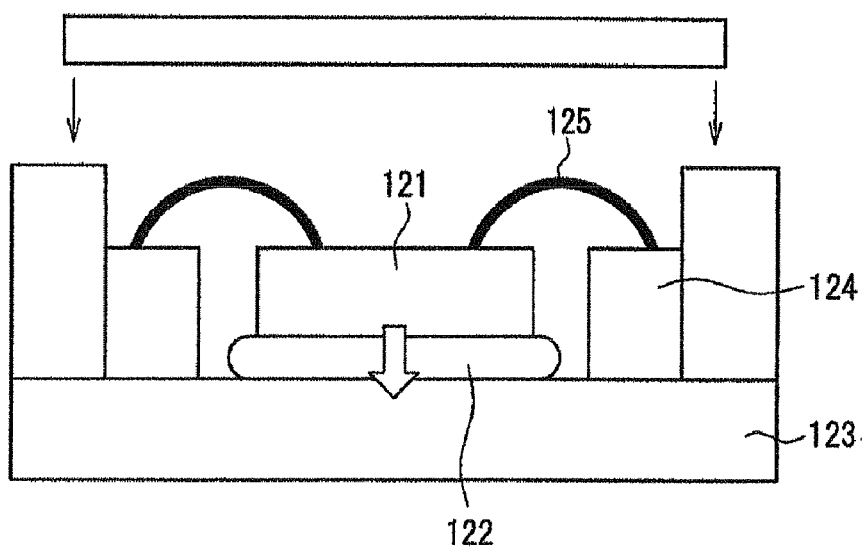
FIG. 16B is a cross-sectional view illustrating the conventional filter package.
Figure 17A:
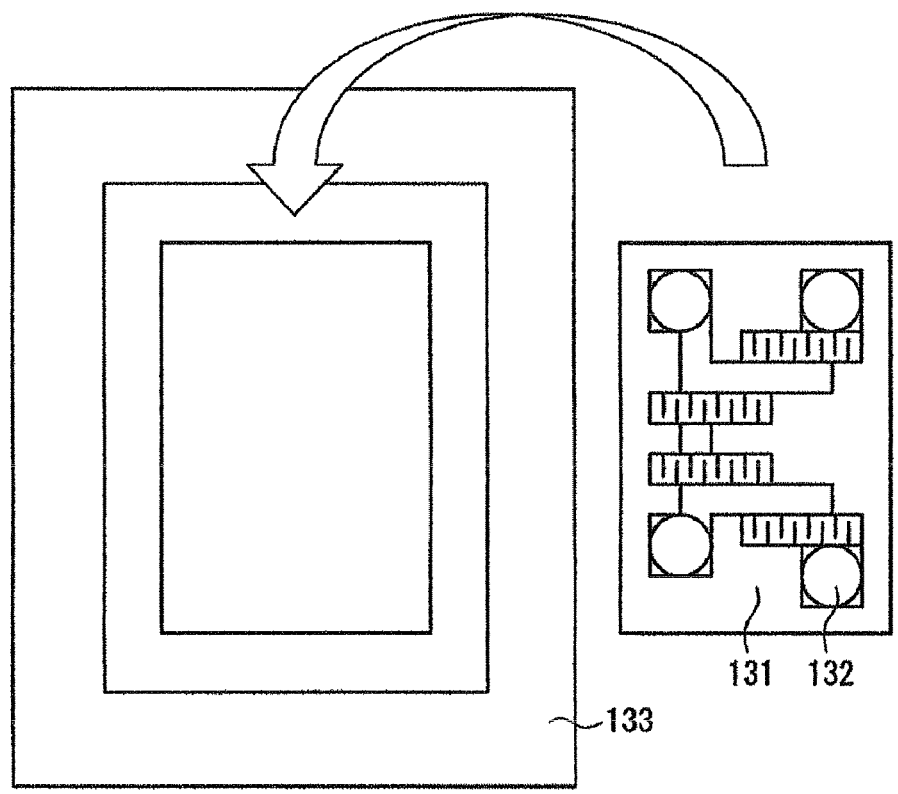
FIG. 17A is a top view illustrating another filter package.
Figure 17B:
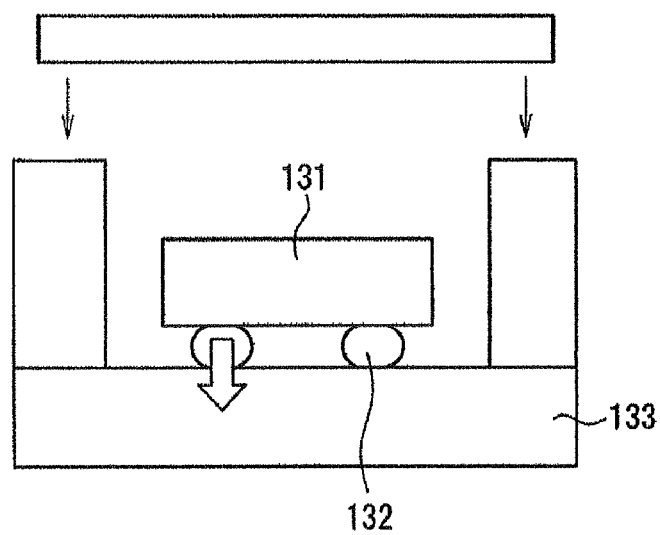
FIG. 17B is a cross-sectional view illustrating the other filter package.
Figure 18:
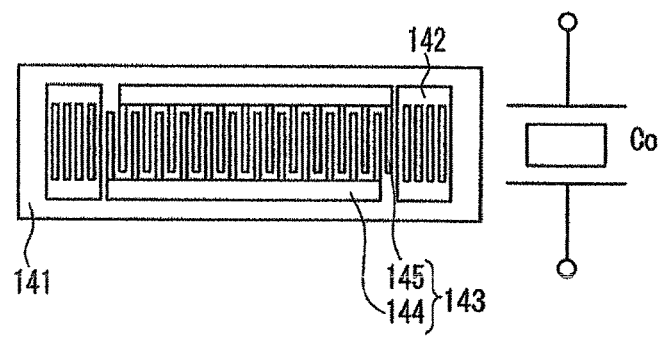
FIG. 18 is a top view illustrating a structure of a 1 port resonator.
Figure 19:
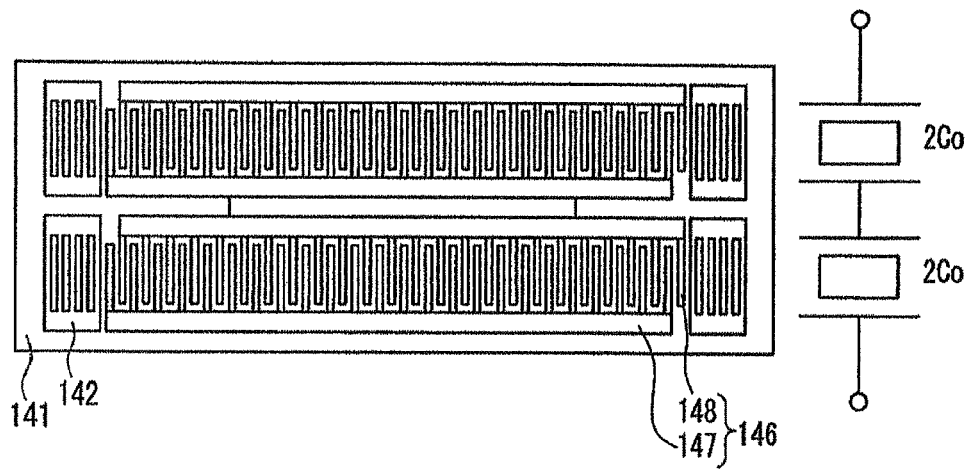
FIG. 19 is a top view illustrating a configuration in which resonators having a doubled number of comb-shaped electrodes have been connected in series.
Figure 20:
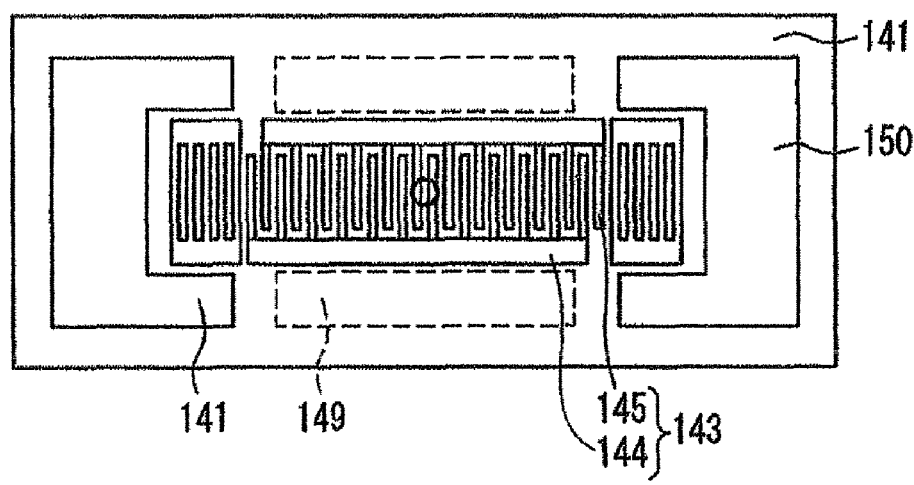
FIG. 20 is a top view illustrating a structure of a 1 port resonator.

FIG. 14 is a configuration diagram illustrating a communication apparatus according to Embodiment 2 of the present invention. The communication apparatus has an antenna 71, a duplexer 72, a transmission-side signal processing unit 73, a reception-side signal processing unit 74, a microphone 75, and a speaker 76. The duplexer 72 has a transmission filter 77 and a reception filter 78 that employ a filter of the embodiment. The reception filter 78 has a different passband (reception band) from the passband of the transmission filter 77.

The microphone 75 converts audio into an audio signal, and inputs the audio signal to the transmission-side signal processing unit 73. The transmission-side signal processing unit 73 generates a transmission signal by modulating the audio signal. The duplexer 72 inputs the transmission signal generated by the transmission-side signal processing unit 73 to the antenna 71.

The antenna 71 converts the transmission signal into radio waves, and outputs the radio waves. Also, the antenna 71 converts radio waves into a reception signal, which is an electrical signal, and inputs the reception signal to the duplexer 72. In the duplexer 72, the reception filter 78 allows a reception band portion of the reception signal to pass, and inputs the resulting reception signal to the reception-side signal processing unit 74. On the other hand, the transmission filter 77 does not allow the reception signal to pass since the passband thereof is different from the reception band. Accordingly, the reception signal is not input to the transmission-side signal processing unit 73. The reception-side signal processing unit 74 generates an audio signal by performing processing such as wave detection and amplification on the reception signal. The speaker 76 converts the audio signal into audio, and outputs the audio.

The transmission filter 77 and the reception filter 78 use a ladder filter 5 having the configuration illustrated in FIG. 1, and therefore a rise in the temperature of the filter due to the generation of heat can be suppressed. Accordingly, the power durability rises, and stable use of the communication apparatus is possible.

Note that although the communication apparatus has been described as having a configuration including the microphone 75 and the speaker 76, there is no limitation to such configuration, and the communication apparatus may be an apparatus that does not necessarily need the microphone 75 or the speaker 76, or an apparatus that transmits and receives data other than audio data, such as a personal computer.

Although embodiments of the present invention have been described above, the present invention is not limited to the such specific embodiments, and various modifications and variations can be made within the scope of the gist of the present invention disclosed in the claims.

INDUSTRIAL APPLICABILITY

A filter of the present invention has a superior power durability, and is applicable to, for example, a duplexer in a communication apparatus.

Examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

The invention claimed is:

1. An elastic wave device comprising:
a resonator having a piezoelectric substrate, a resonation unit formed on the piezoelectric substrate, and reflectors formed on respective sides of the resonation unit on the piezoelectric substrate; and
a bump formed on the piezoelectric substrate,
wherein the resonator is configured such that two or more split resonators are connected in parallel, and the bump is formed in a region sandwiched between reflectors of the split resonators and is electrically and acoustically separated from the resonator.

2. The elastic wave device according to claim 1, having signal wiring connected to the resonation unit,
wherein the bump is surrounded by the signal wiring and the reflectors.

3. The elastic wave device according to claim 1, wherein the bump is connected to a ground.

4. The elastic wave device according to claim 1, wherein the bump is connected to external wiring.

5. The elastic wave device according to claim 1, wherein the split resonators each have the same number of pairs of comb-shaped electrodes.

6. The elastic wave device according to claim 1, wherein in each of the split resonators, comb-shaped electrodes are formed using the same design.

7. The elastic wave device according to claim 1, wherein a material of the bump is Au.

8. A filter comprising the elastic wave device according to claim 1, wherein the elastic wave device includes a plurality of resonators, and the plurality of resonators are connected.

9. A duplexer comprising:
a transmission filter; and
a reception filter having a pass frequency band different from that of the transmission filter,
wherein at least one of the transmission filter and the reception filter is configured using the filter according to claim 8.

10. A communication apparatus comprising:
an antenna;
the duplexer according to claim 9 that is connected to the antenna; and a signal processing unit connected to the duplexer.

* * * * *